United States Patent [19]
Usui

[11] Patent Number: 5,896,180
[45] Date of Patent: Apr. 20, 1999

[54] PHASE-LOCKED LOOP CIRCUIT FOR GENERATING STABLE CLOCK SIGNAL FOR USE IN REGENERATION OF PICTURE SIGNAL

[75] Inventor: Toshiaki Usui, Kawasaki, Japan

[73] Assignee: Fujitsu Limited, Kawasaki, Japan

[21] Appl. No.: 08/694,547

[22] Filed: Aug. 9, 1996

[30] Foreign Application Priority Data

Dec. 21, 1995 [JP] Japan ................................ 7-333478

[51] Int. Cl.$^6$ ................................ H04N 5/06
[52] U.S. Cl. ........................ 348/547; 348/194; 348/505
[58] Field of Search ........................ 348/536, 539, 348/537, 549, 505, 508, 545, 542, 543, 544, 546, 547, 548, 194, 506; 358/148, 19, 21 R, 25, 17; 331/14, 1 A, 20

[56] References Cited

U.S. PATENT DOCUMENTS

| | | | |
|---|---|---|---|
| 3,974,520 | 8/1976 | Kuroyanagi | 358/17 |
| 4,561,014 | 12/1985 | Duziech et al. | 358/25 |
| 4,736,238 | 4/1988 | Moriyama et al. | 358/19 |
| 4,769,704 | 9/1988 | Hirai et al. | 358/148 |
| 4,847,678 | 7/1989 | McCauley | 358/19 |
| 4,860,090 | 8/1989 | Murata et al. | 358/21 R |

FOREIGN PATENT DOCUMENTS

| | | |
|---|---|---|
| 61-202378 | 9/1986 | Japan . |
| 63-084393 | 4/1988 | Japan . |
| 1-32590 | 2/1989 | Japan . |

Primary Examiner—Andrew I. Faile
Assistant Examiner—Uyen Le
Attorney, Agent, or Firm—Staas & Halsey

[57] ABSTRACT

A phase-locked loop circuit generates a clock signal synchronized with a color burst signal contained in a composite color picture signal. The phase-locked loop circuit contains a phase synchronization loop having a loop gain, extracts the color burst signal from the composite color picture signal, compares the phases of the generated clock signal and the color burst signal, and controls the phase of the generated clock signal to reduce the difference between the above phases. The phase-locked loop circuit further detects the vertical blanking signal, and reduces the loop gain for the duration of the vertical blanking signal. Alternatively, a horizontal synchronizing signal is used instead of the color burst signal. Another phase-locked loop circuit generates a clock signal synchronized with a reference clock signal based on first frequency information indicating a frequency of the reference clock signal. This phase-locked loop circuit generates the clock signal so that the phase of the generated clock signal is controlled according to an output of an amplifier. Second frequency information indicating the frequency of the generated clock signal is generated, and a difference between the frequencies of the reference clock signal and the generated clock signal is obtained. The amplifier amplifies the difference with a gain which can be controlled externally. When a change in the polarity of the difference, a large amount of the absolute value of the difference, or a loss of the first information, is detected, the gain is reduced or suppressed.

3 Claims, 9 Drawing Sheets

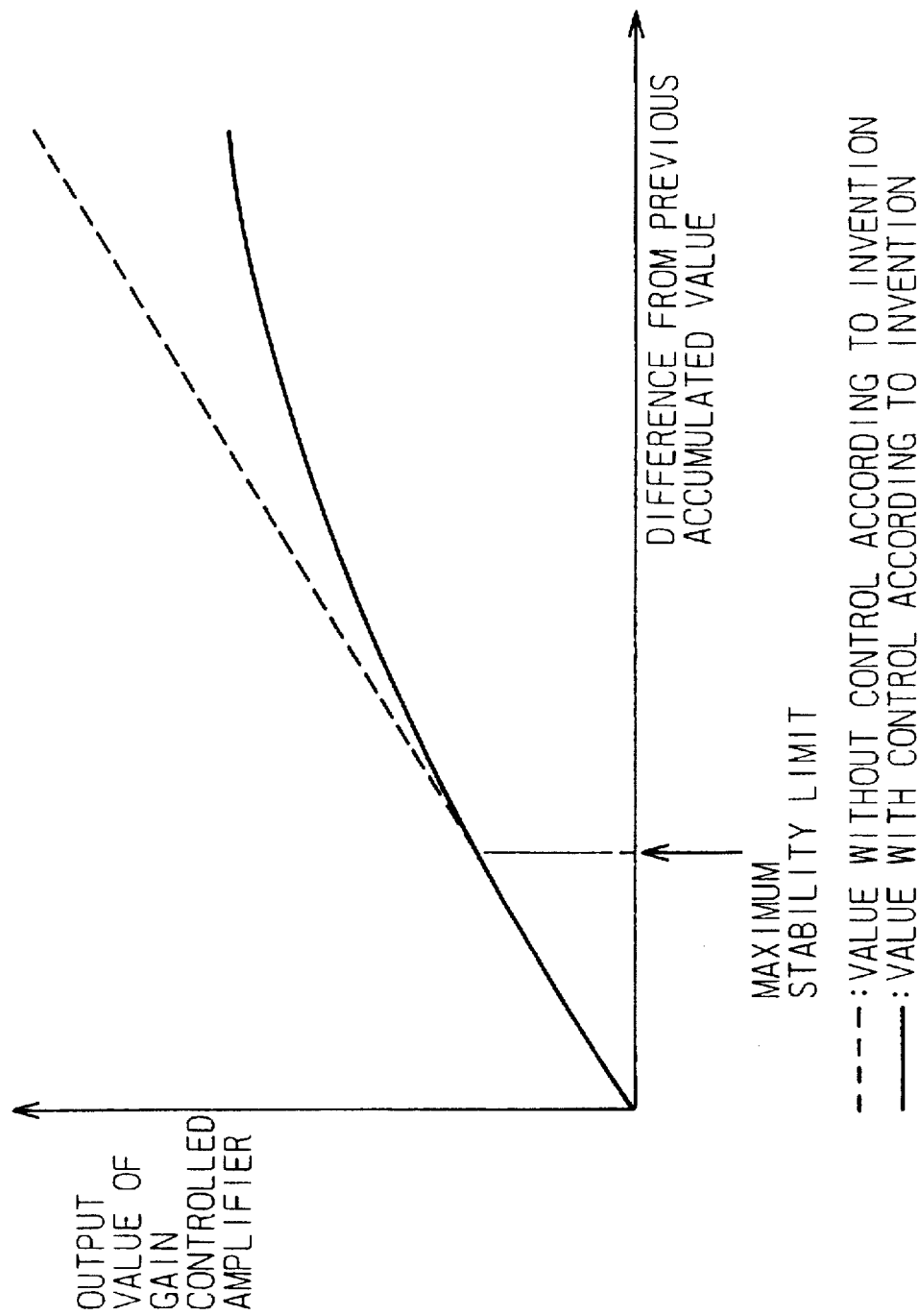

PHASE-LOCKED LOOP CIRCUIT FOR GENERATING STABLE CLOCK SIGNAL FOR USE IN REGENERATION OF PICTURE SIGNAL

BACKGROUND OF THE INVENTION

1. Field of the Invention

The present invention relates to a phase-locked loop (PLL) circuit which generates a clock signal synchronized with a color burst signal contained in a composite color picture signal (composite picture signal).

The present invention further relates to a phase-locked loop circuit which is provided on a receiver side of a digital transmission system, and which regenerates a clock signal which is used on a transmitter side, based on information on the frequency of the clock signal. In particular, the present invention relates to a phase-locked loop circuit which is provided on a receiver side of a picture signal transmitting system, and regenerates a sampling clock signal which is used on a transmitter side for sampling an original picture signal to generate the (sampled) picture signal to be transmitted, where a transmission clock signal used for transmitting the picture signal does not synchronize with the sampling clock signal.

2. Description of the Related Art

In a picture signal transmitting system transmitting a composite color picture signal, high quality is required for a composite color picture signal which is regenerated on a receiver side from a received picture signal. In particular, the precision of frequencies and vector stability of color signals depend on the precision of a clock signal which is used for regenerating a composite color picture signal. Such a clock signal is generated as a clock signal which synchronizes with a color burst signal contained in the composite color picture signal.

According to one of the conventional methods of regenerating a clock signal which synchronizes with a color burst signal contained in the composite color picture signal, first, the color burst signal is extracted by generating, based on the timing of the horizontal synchronizing signal, a gate pulse which is active at the timing of the color burst signal in the composite color picture signal, and extracting the color burst signal by using the gate pulse. Then, the extracted color burst signal is used as a reference signal in a phase-locked loop circuit which generates the clock signal. In the phase-locked loop circuit, the phase of the generated clock signal is compared with the phase of the extracted color burst signal for each timing of the horizontal synchronizing signal to control the phase of the clock signal so that the clock signal synchronizes with the color burst signal.

However, no color burst signal exists for the time of a vertical blanking signal contained in the composite color picture signal. Therefore, the frequency of the clock signal may fluctuate in the duration of a vertical blanking signal due to the absence of the color burst signal as a reference signal. Conventionally, a second phase-locked loop circuit is provided in the stage following the above phase-locked loop circuit to reduce the fluctuation of the frequency of the clock signal. However, since the period of the variation of the frequency is long, the comparison frequency (the frequency of phase comparison performed) in the second phase-locked loop circuit must be low. The low comparison frequency in the second phase-locked loop circuit results in a low loop gain in the second phase-locked loop circuit, and the pulling-in operation at a transitional period becomes slow due to the low loop gain.

When a transmission clock signal used for transmitting sampled information does not synchronize with a sampling clock signal which is used on a transmitter side for sampling certain information to generate the (sampled) information to be transmitted, it is required to regenerate, on a receiver side, the sampling clock signal synchronized with the transmitted information, and the regenerated sampling clock signal must have a precise frequency.

For example, when a transmission clock signal used for transmitting a (sampled) picture signal does not synchronize with a sampling clock signal which is used on a transmitter side for sampling an original picture signal to generate the (sampled) picture signal to be transmitted, it is required to regenerate on a receiver side the sampling clock signal synchronized with the transmitted picture signal, where the regenerated sampling clock signal must have a precise frequency.

According to one of the conventional methods of regenerating on a receiver side a clock signal synchronized with a picture signal sampled on the transmitter side in a picture transmission system in which a transmission clock signal used for transmitting the picture signal does not synchronize with a sampling clock signal used for sampling an original picture signal to generate the (sampled) picture signal to be transmitted, first information on a first difference between frequencies of the sampling clock signal and the transmission clock signal is generated on the transmitter side, and is transmitted together with the picture signal to the receiver side. Then, in a phase-locked loop circuit on the receiver side, second information on a second difference between frequencies of a regenerated sampling clock signal which is regenerated by the phase-locked loop circuit and the transmission clock signal is generated in the same manner as the manner in which the first information is generated on the transmitter side, and a third difference between the first and second differences is obtained to control a voltage controlled oscillator in the phase-locked loop circuit based on the third difference so that a clock signal which synchronizes with the picture signal is regenerated as the sampling clock signal.

However, the conventional phase-locked loop circuit which is to be used on a receiver side of a picture transmission system in which a transmission clock signal used for transmitting a picture signal does not synchronize with a sampling clock signal which is used on a transmitter side for sampling an original picture signal to generate the (sampled) picture signal to be transmitted, has the following drawbacks.

(1) Firstly, the frequency of the regenerated sampling clock signal rapidly varies at a transitional period such as the time of power-on or the stop of the transmission of the picture signal, and therefore the color signals which are regenerated from the composite color picture signal by using the regenerated sampling clock signal rapidly vary. This may cause irregular chromaticity in the regenerated color picture.

(2) Secondly, the frequency of the regenerated sampling clock signal greatly swings back and forth before converging on the frequency of the original sampling clock signal, for example, at a transitional period such as the time of power-on or the stop of the reception of the picture signal.

(3) Thirdly, the converging time of the regenerated sampling clock signal is long.

(4) Fourthly, the frequency of the regenerated sampling clock signal regenerated on the receiver side may greatly vary when the transmission of the picture signal is stopped or restarted. This may cause irregular chromaticity in the regenerated color picture at a transitional period caused by the stop or restart of the picture signal.

SUMMARY OF THE INVENTION

A first object of the present invention is to provide a phase-locked loop circuit which suppresses the fluctuation of the frequency of an output clock signal when the color burst signal as a reference signal is absent, while the pulling-in operation at a transitional period is not slowed.

A second object of the present invention is to provide a phase-locked loop circuit which is provided on a receiver side of a digital transmission system, and which regenerates a clock signal which is used on a transmitter side, based on information on the frequency of the clock signal, wherein the frequency of a regenerated clock signal which is obtained as an output of the phase-locked loop circuit, does not rapidly vary at the transitional period such as the time of power-on or the stop of the transmission in the digital transmission system.

A third object of the present invention is to provide a phase-locked loop circuit which is provided on a receiver side of a digital transmission system, and which regenerates a clock signal which is used on a transmitter side, based on information on the frequency of the clock signal, wherein the frequency of a regenerated sampling clock signal which is obtained as an output of the phase-locked loop circuit, does not greatly swing back and forth before converging on the frequency of the original clock signal, for example, at the transitional period such as the time of power-on or the stop of the transmission in the digital transmission system.

A fourth object of the present invention is to provide a phase-locked loop circuit which is provided on a receiver side of a digital transmission system, and which regenerates a clock signal which is used on a transmitter side, based on information on the frequency of the clock signal, wherein the frequency of a regenerated clock signal which is obtained as an output of the phase-locked loop circuit, converges in a short time.

A fifth object of the present invention is to provide a phase-locked loop circuit which is provided on a receiver side of a digital transmission system, and which regenerates a clock signal which is used on a transmitter side, based on information on the frequency of the clock signal, wherein the frequency of a regenerated clock signal which is obtained as an output of the phase-locked loop circuit, does not vary substantially when the transmission in the digital transmission system is stopped or restarted.

(1) According to the first aspect of the present invention, there is provided a phase-locked loop circuit which contains a phase-locked loop circuit for generating a clock signal synchronized with a color burst signal contained in a composite color picture signal which contains a vertical blanking signal. The phase-locked loop circuit contains a burst signal extracting unit for inputting the composite color picture signal, extracting the color burst signal from the composite color picture signal, and outputting a reference signal indicating a phase of the color burst signal as a first phase; a phase-locked loop unit, containing a phase synchronization loop having a loop gain, for generating said clock signal so that the generated clock signal synchronizes with the color burst signal, by comparing a phase of the generated clock signal with the phase of the color burst signal extracted by the burst signal extracting unit, and by controlling the phase of the generated clock signal to reduce a difference between the phases of the generated clock signal and the color burst signal; a vertical blanking signal detecting unit for detecting the vertical blanking signal; and a loop gain control unit for controlling the phase-locked loop unit so that the loop gain in the phase synchronization loop is reduced when the vertical blanking signal is detected by the vertical blanking signal detecting unit.

(2) According to the second aspect of the present invention, there is provided a phase-locked loop circuit for generating a clock signal synchronized with a color burst signal contained in a composite color picture signal which contains a vertical blanking signal and a synchronizing signal which has the same frequency as a horizontal synchronizing signal. The phase-locked loop circuit contains a burst signal extracting unit for inputting the composite color picture signal, extracting the color burst signal from the composite color picture signal, and outputting a first reference signal which indicates timing of the color burst signal; a horizontal-synchronizing-signal-basis reference signal generating unit for inputting the composite color picture signal, extracting the synchronizing signal from the composite color picture signal, and generating, based on the timing of the synchronizing signal, a second reference signal which indicates timing synchronized with the color burst signal; a vertical blanking signal detecting unit for detecting a first duration of the vertical blanking signal; a reference signal selecting unit for selecting the first reference signal for a second duration other than the first duration, and selecting the second reference signal for the first duration, to supply the selected one of the first and second reference signals to a phase-locked loop unit as a phase reference signal; and a phase-locked loop unit. The phase-locked loop unit generates the above clock signal so that the generated clock signal synchronizes with the phase reference signal.

(2-1) In the phase-locked loop circuit according to the second aspect of the present invention, the above phase-locked loop unit 3' may contain a phase comparing unit for comparing the phase of the generated clock signal with the phase of the phase reference signal to output a result of the comparison, a controlled oscillator unit for generating the above clock signal, where the phase of the generated clock signal is controlled according to the result of the comparison, and a frequency dividing unit for dividing a frequency of the clock signal. The above frequency dividing unit may contain a first frequency dividing unit for generating a first frequency-divided clock signal for use in the phase comparing unit when the reference signal selecting unit selects the first reference signal, a second frequency dividing unit for generating a second frequency-divided clock signal for use in the phase comparing unit when the reference signal selecting unit selects the second reference signal, and a frequency-divided clock signal selecting unit for selecting the first frequency-divided clock signal for a second duration excluding the first duration, and selecting the second frequency-divided clock signal for the first duration to supply the selected one of the first and second frequency-divided clock signals to the phase comparing unit for phase comparison with the phase reference signal.

(3) According to the third aspect of the present invention, there is provided a phase-locked loop circuit for generating a clock signal synchronized with a reference clock signal based on first frequency information which indicates a frequency of the reference clock signal. The phase-locked loop circuit contains a controlled oscillator unit for generating the above clock signal, where a phase of the generated clock signal is controlled according to an output of an amplifying unit; a loopback signal generating unit for generating second frequency information which indicates a frequency of the generated clock signal; a frequency comparing unit for obtaining a difference between the frequencies of the reference clock signal and the generated clock signal; the above amplifying unit for amplifying the difference with a gain which can be controlled externally; and a gain control unit for detecting a change in a polarity of the difference, and reducing the gain when the change is detected.

(3-1) The phase-locked loop circuit according to the third aspect of the present invention may further contain an accumulating unit for accumulating the output of the amplifying unit, and the above controlled oscillator unit may generate the above clock signal so that the phase of the generated clock signal is controlled according to an output of the accumulating unit instead of the output of an amplifying unit.

(4) According to the fourth aspect of the present invention, there is provided a phase-locked loop circuit for generating a clock signal synchronized with a reference clock signal based on first frequency information which indicates a first frequency of the reference clock signal. The phase-locked loop circuit contains a controlled oscillator unit for generating the above clock signal, where a phase of the generated clock signal is controlled according to an output of an amplifying unit; a loopback signal generating unit for generating second frequency information which indicates a second frequency of the generated clock signal; a frequency comparing unit for generating, as a first difference, a difference between the frequencies of the reference clock signal and the generated clock signal; the above amplifying unit for amplifying the first difference with a gain which can be controlled externally; and a gain control unit for detecting an absolute value of the first difference, and reducing the gain when the absolute value is detected to exceed a predetermined value.

(4-1) The phase-locked loop circuit according to the fourth aspect of the present invention may further contain an accumulating unit for periodically accumulating the output of the amplifying unit, and outputting an accumulated value for each cycle of the periodical accumulating operation thereof, and a calculating unit for calculating as a second difference a difference between the accumulated value for a current cycle and the accumulated value for a previous cycle. In the phase-locked loop circuit, the controlled oscillator unit generates the above clock signal so that the phase of the generated clock signal is controlled according to an output of the accumulating unit instead of the output of the amplifying unit, and the gain control unit reduces the gain when the absolute value of the second difference is detected to exceed a predetermined value.

(5) According to the fifth aspect of the present invention, there is provided a phase-locked loop circuit for generating a clock signal synchronized with a reference clock signal based on first frequency information which indicates a first frequency of the reference clock signal. The phase-locked loop circuit contains a controlled oscillator unit for generating the above clock signal, where a phase of the generated clock signal is controlled according to an output of an amplifying unit; a loopback signal generating unit for generating second frequency information which indicates a second frequency of the generated clock signal; a frequency comparing unit for obtaining a difference between the first and second frequencies; the above amplifying unit for amplifying the difference with a gain which can be controlled externally; and a gain control unit for detecting an input of third information indicating a loss of the first information, and suppressing the gain when the input of third information is detected.

(5-1) The phase-locked loop circuit according to the fifth aspect of the present invention may further contain an accumulating unit for periodically accumulating the output of the amplifying unit, and in this case, the controlled oscillator unit generates the above clock signal so that the phase of the generated clock signal is controlled according to an output of the accumulating unit instead of the output of the amplifying unit.

BRIEF DESCRIPTION OF THE DRAWINGS

In the drawings:

FIG. 9 is a diagram for indicating an example of the gain reduction in the gain controlled amplifier in the fourth aspect of the present invention.

DESCRIPTION OF THE PREFERRED EMBODIMENTS

Figure 1:
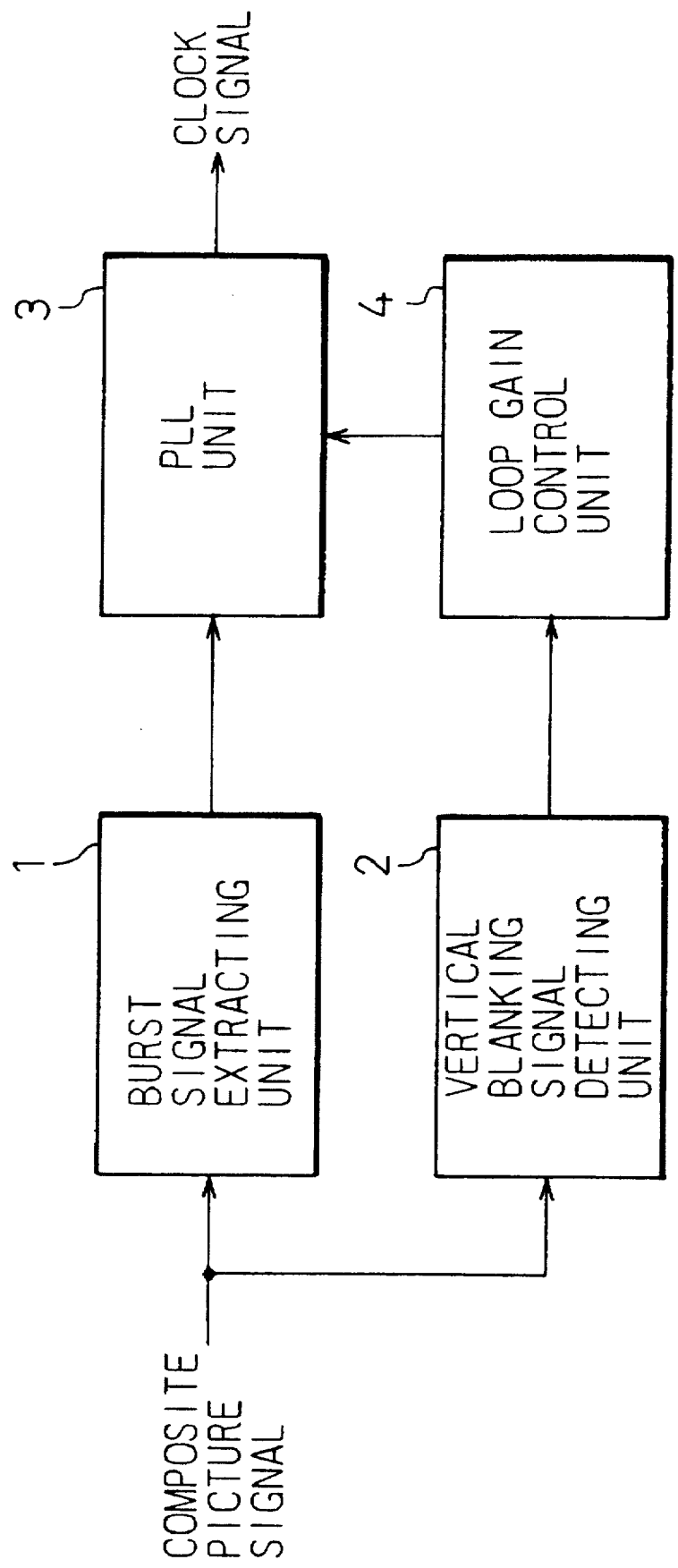
FIG. 1 is a diagram illustrating the basic construction of the first aspect of the present invention.

Basic Construction of First Aspect of Present Invention (FIG. 1)

FIG. 1 is a diagram illustrating the basic construction of the first aspect of the present invention. In the construction of FIG. 1, reference numeral 1 denotes a burst signal extracting unit, 2 denotes a vertical blanking signal detecting unit, 3 denotes a phase-locked loop unit, and 4 denotes a loop gain control unit.

The phase-locked loop circuit indicated in FIG. 1 is provided for generating a clock signal synchronized with a color burst signal contained in a composite color picture signal which contains a vertical blanking signal. When a composite color picture signal is input into the phase-locked loop circuit of FIG. 1, the color burst signal is extracted from the composite color picture signal by the burst signal extracting unit 1, and the duration of the vertical blanking signal in the composite color picture signal is detected by the vertical blanking signal detecting unit 2. The color burst signal, or at least information on the timing of the color burst signal, is supplied to the phase-locked loop unit 3. The phase-locked loop unit 3 contains a phase synchronization loop having a loop gain which can be controlled externally, and generates the above clock signal so that the generated clock signal synchronizes with the color burst signal. In the phase-locked loop unit 3, a first phase of the generated clock signal is compared with a second phase of the color burst signal, and the phase of the generated clock signal is controlled to reduce a difference between the first and second phases. The loop gain control unit 4 controls the phase-locked loop unit 3 so that the loop gain in the phase synchronization loop is reduced when the vertical blanking signal is detected by the vertical blanking signal detecting unit 2.

According to the above construction of the first aspect of the present invention, the loop gain of the phase-locked loop unit 3 is reduced when no color burst signal is contained in the composite color picture signal. Therefore, the clock signal generated by the phase-locked loop circuit of FIG. 1 is less affected by the absence of the color burst signal. Since the additional phase-locked loop unit as in the aforementioned conventional construction is not provided in the above construction of FIG. 1, the pulling-in operation is not slowed.

Figure 2:
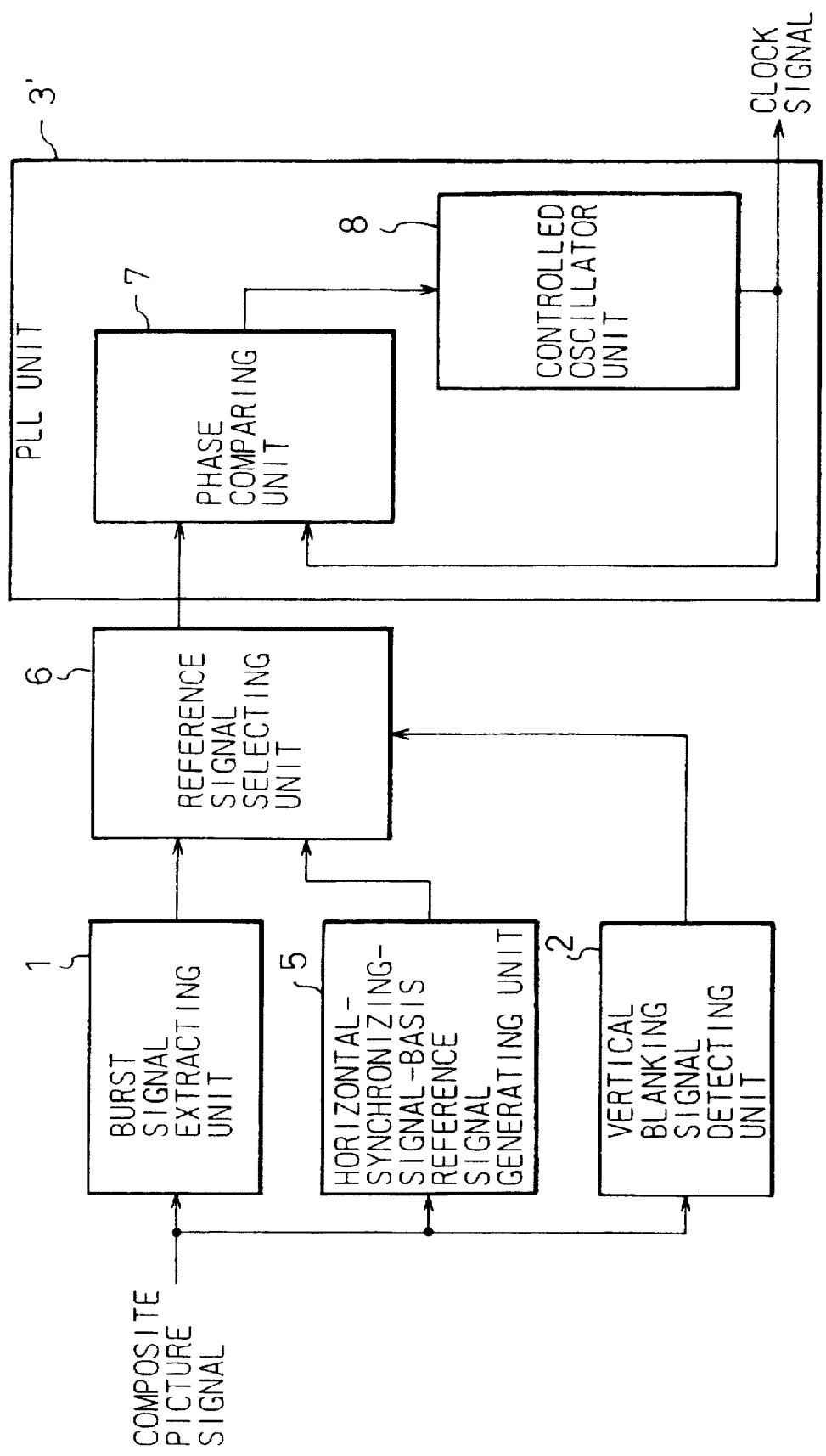
FIG. 2 is a diagram illustrating the basic construction of the second aspect of the present invention.

Basic Construction of Second Aspect of Present Invention (FIG. 2)

FIG. 2 is a diagram illustrating the basic construction of the second aspect of the present invention. In the construction of FIG. 1, reference numeral 1 denotes a burst signal extracting unit, 2 denotes a vertical blanking signal detecting unit, 3' denotes a phase-locked loop unit, 5 denotes a horizontal-synchronizing-signal-basis reference signal generating unit, 6 denotes a reference signal selecting unit, 7 denotes a phase comparing unit, and 8 denotes a controlled oscillator unit.

The phase-locked loop circuit indicated in FIG. 2 is provided for generating a clock signal synchronized with a color burst signal contained in a composite color picture signal which contains a vertical blanking signal and a synchronizing signal which has the same frequency as a horizontal synchronizing signal. The synchronizing signal which has the same frequency as the horizontal synchronizing signal, may include the horizontal synchronizing signal per se, every second one of the equalizing pulses (the frequency of which is twice the frequency of the horizontal synchronizing signal), and the like. In the phase-locked loop circuit of FIG. 2, the color burst signal is extracted from the composite color picture signal by the burst signal extracting unit 1, and the first reference signal indicating the timing of the color burst signal is supplied to the reference signal selecting unit 6. In addition, the timing of the above synchronizing signal is detected by the horizontal-synchronizing-signal-basis reference signal generating unit 5, the second reference signal indicating the timing synchronized with the synchronizing signal is generated based on the synchronizing signal, and the second reference signal is supplied to the reference signal selecting unit 6. The duration of the vertical blanking signal in the composite color picture signal is detected as a first duration by the vertical blanking signal detecting unit 2, and the information on the first duration is supplied to the reference signal selecting unit 6 as a selection control signal. According to the selection control signal, the reference signal selecting unit 6 selects the first reference signal for a duration (referred to as a second duration) other than the first duration, and selects the second reference signal for the first duration. The selected one of the first and second reference signals is supplied to a phase-locked loop unit 3' as a phase reference signal. The phase-locked loop unit 3' generates the above clock signal so that the generated clock signal synchronizes with the phase reference signal.

According to the above construction of the second aspect of the present invention, the timing of the synchronizing signal is used to generate the second reference signal indicating timing synchronized with the color burst signal, and the second reference signal is supplied to the phase-locked loop unit, instead of the first reference signal generated based on the color burst signal, for the time in which no color burst signal is contained in the composite color picture signal. Since it is known that there is a constant phase difference between the color burst signal and the horizontal synchronizing signal in the composite color picture signal, a timing synchronized with the color burst signal can be generated from the synchronizing signal which has the same frequency as the horizontal synchronizing signal. Therefore, the clock signal generated by the phase-locked loop circuit of FIG. 2 is not affected (for example, does not drift) due to the absence of the color burst signal. Since the additional phase-locked loop unit as in the aforementioned conventional construction is not provided in the above construction of FIG. 2, the pulling-in operation is not delayed.

Figure 3:
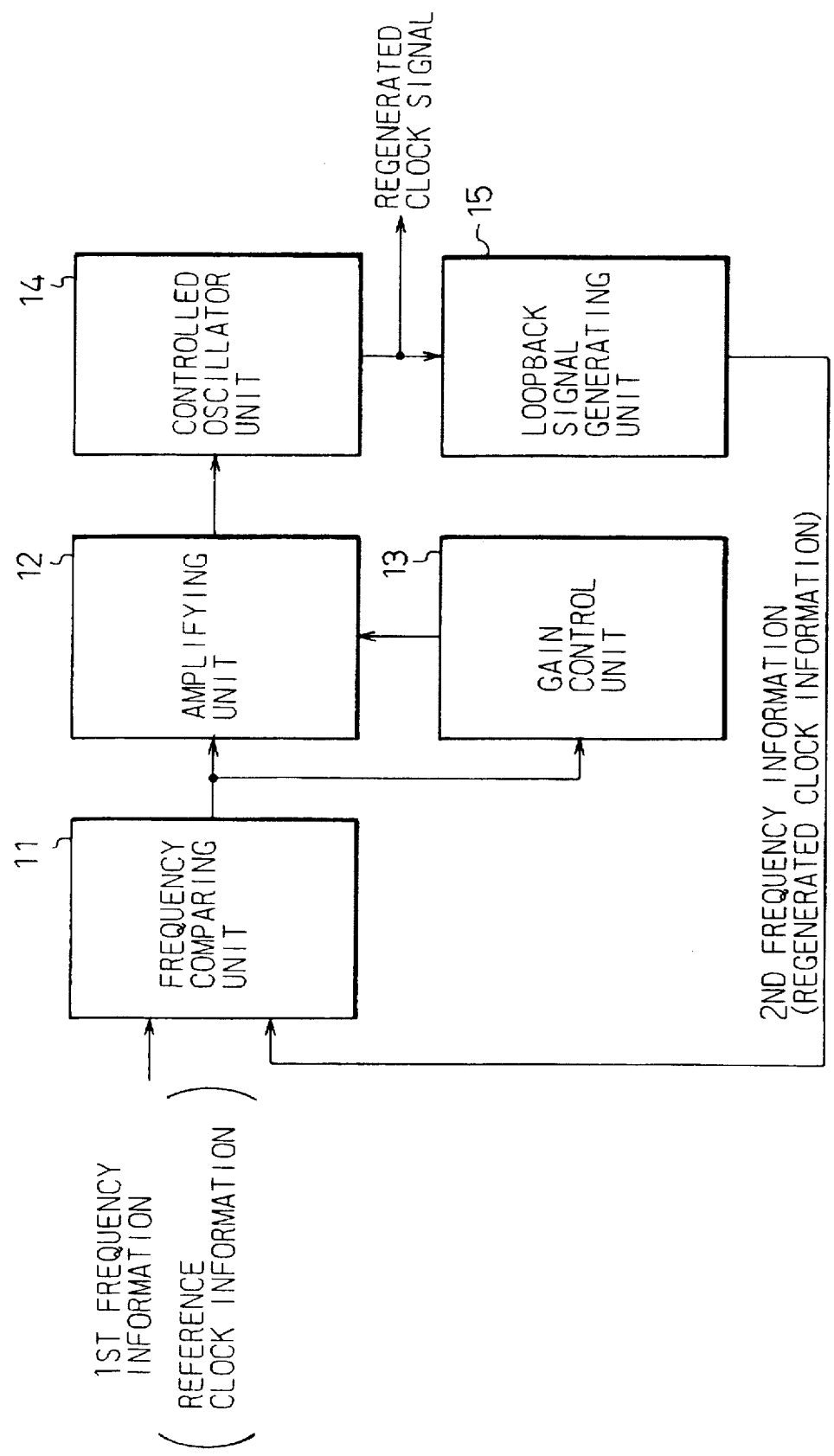
FIG. 3 is a diagram illustrating the basic construction of the third and fourth aspects of the present invention.

Basic Construction of Third and Fourth Aspects of Present Invention (FIG. 3)

FIG. 3 is a diagram illustrating the basic construction of the third and fourth aspects of the present invention. In the construction of FIG. 3, reference numeral 11 denotes a frequency comparing unit, 12 denotes an amplifying unit, 13 denotes a gain control unit, 14 denotes a controlled oscillator unit, and 15 denotes a loopback signal generating unit.

The phase-locked loop circuit indicated in FIG. 3 is provided for generating a clock signal synchronized with a reference clock signal based on first frequency information which indicates a first frequency of the reference clock signal. The controlled oscillator unit 14 generates the above clock signal, where a phase of the generated clock signal is controlled according to an output of the amplifying unit 12. The loopback signal generating unit 15 generates second frequency information which indicates a second frequency of the generated clock signal. The frequency comparing unit 11 generates a difference between the first and second frequencies. The above amplifying unit 12 amplifies the difference with a gain which can be controlled externally.

In the case wherein the construction of FIG. 3 operates as the third aspect of the present invention, the gain control unit 13 detects a change in the polarity of the difference, and reduces the gain to a low level when the change is detected.

According to the above construction of the third aspect of the present invention, the gain in the phase synchronization loop in the phase-locked loop circuit is reduced when the phase of the generated clock signal has reached and just passed the phase of the reference clock signal, i.e., immediately after the phase of the generated clock signal has passed the phase of the reference clock signal. Therefore, the phase of the clock signal does not greatly swing back and forth around the phase of the reference clock signal, and the frequency of the generated clock signal converges in a short time.

In the case wherein the construction of FIG. 3 operates as the fourth aspect of the present invention, the gain control unit 13 detects an absolute value of the above difference, and reduces the gain when the absolute value is detected to exceed a predetermined value.

According to the above construction of the fourth aspect of the present invention, the gain in the phase synchronization loop in the phase-locked loop circuit is reduced when the difference between the phase of the generated clock signal and the phase of the reference clock signal becomes great. Therefore, the phase of the clock signal does not rapidly vary at the transitional period such as the time of power-on or the stop of the reception of the picture signal. Thus, for example, when the generated clock signal is a regenerated sampling clock signal which is used for regenerating a transmitted picture signal, irregular chromaticity in the regenerated picture image is prevented or moderated.

Figure 4:
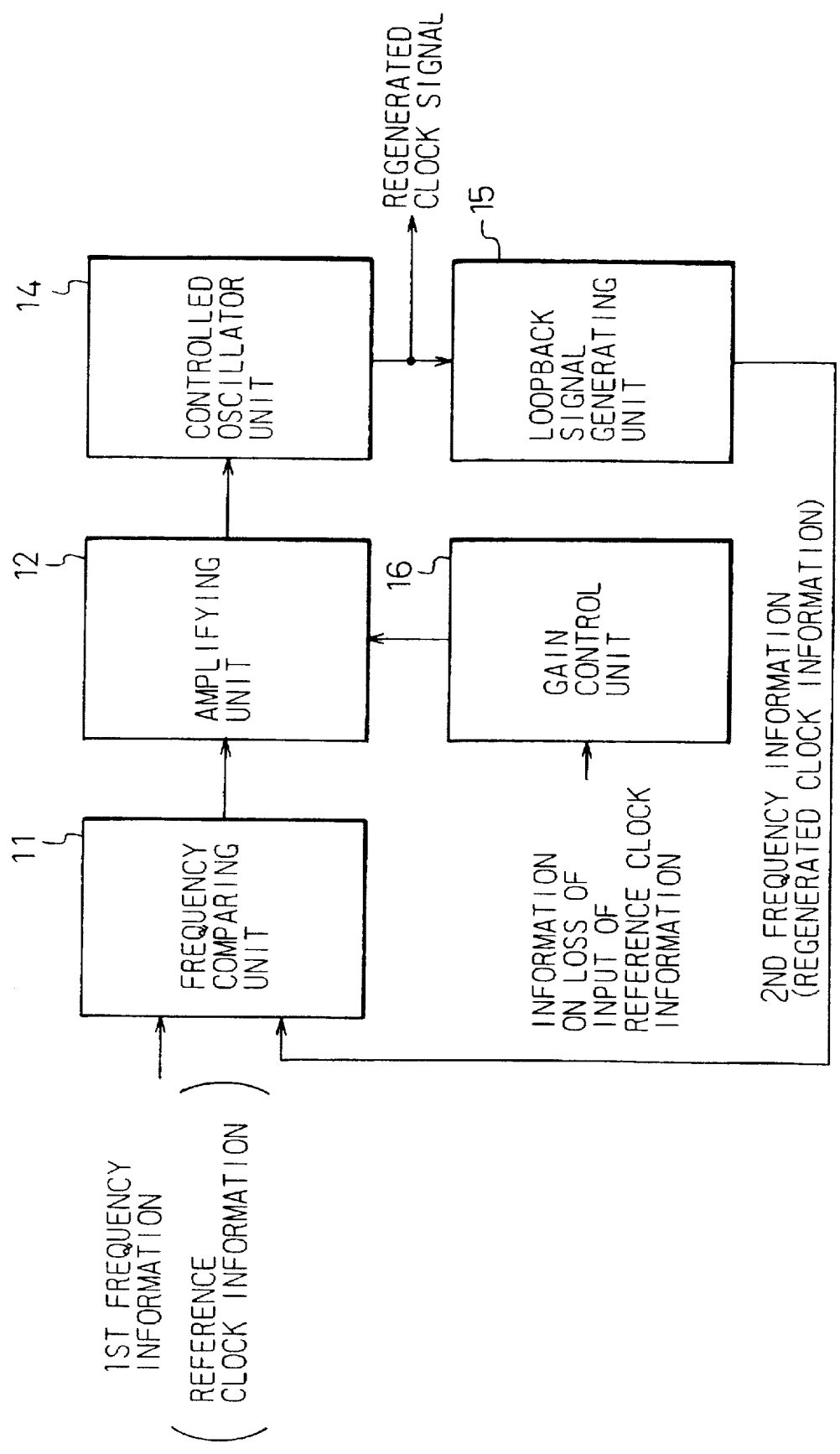
FIG. 4 is a diagram illustrating the basic construction to the fifth aspect of the present invention.

Basic Construction of Fifth Aspect of Present Invention (FIG. 4)

FIG. 4 is a diagram illustrating the basic construction of the fifth aspect of the present invention. In the construction of FIG. 4, reference numeral 16 denotes a gain control unit, and the other elements are the same as the elements in FIG. 3 having the same reference numerals. It is assumed that when the first information (reference clock information) is stopped, information (referred to as a third information) indicating the loss of the first information is generated and supplied to the phase-locked loop circuit of FIG. 4. The third information may be generated in and transmitted from the transmitter side of the picture signal transmission system. Alternatively, the third information may be generated on the receiver side by detecting the loss of the first information.

In the phase-locked loop circuit indicated in FIG. 4, when the gain control unit 16 detects an input of the third information indicating a loss of the first information, the gain control unit 16 suppresses the gain of the amplifying unit 12.

According to the above construction of the fifth aspect of the present invention, the gain in the phase synchronization loop in the phase-locked loop circuit is suppressed when the supply of the first information to the phase-locked loop circuit is stopped. The suppression of the gain may be a complete suppression to a zero gain, or may be a considerable reduction to a very small gain. Therefore, the phase of the clock signal does not substantially vary at the transitional period due to the stop of the reception of the picture signal. Thus, if the original sampling clock signal on the transmitter side is maintained through a stop of the transmission of the first information and a restart of the transmission of the first information following the stop, when the transmission of the first information is restarted after the stop of thereof, the frequency of the regenerated clock signal on the receiver side can converge, in a short time without a great variation, on the frequency of the reference clock signal which is indicated by the first information. Therefore, irregular chromaticity in the regenerated picture image at a transitional period due to the stop or restart of the input of the first information is prevented.

Figure 5:
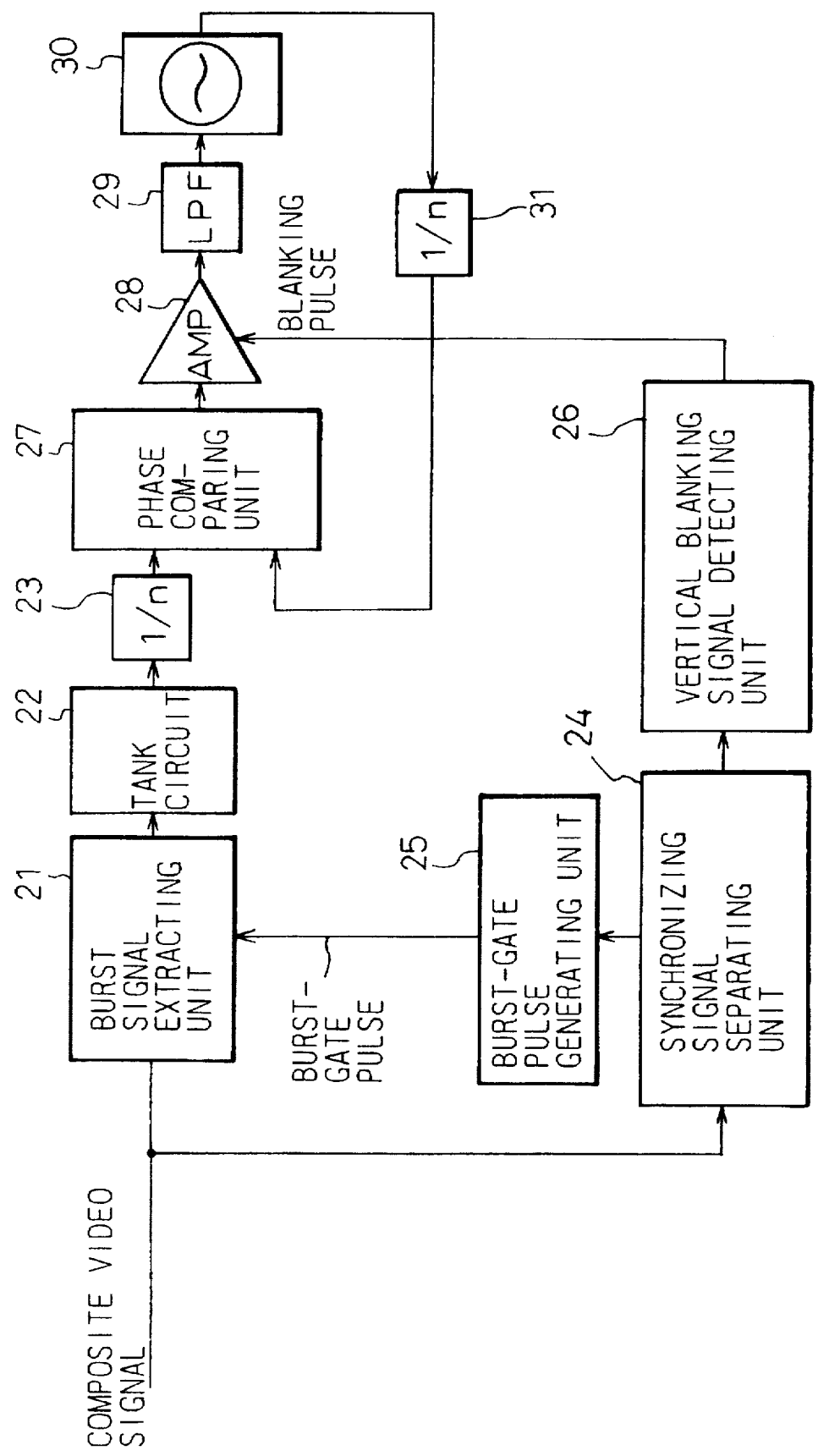
FIG. 5 is a diagram illustrating the construction of an embodiment of the first aspect of the present invention.

Embodiment of First Aspect of Present Invention
(FIG. 5)

FIG. 5 is a diagram illustrating the construction of an embodiment of the first aspect of the present invention. As explained with reference to FIG. 1, the phase-locked loop circuit according to the first aspect of the present invention is provided for generating a clock signal synchronized with a color burst signal contained in a composite color picture signal which contains a vertical blanking signal. In FIG. 5, reference numeral 21 denotes a burst signal extracting unit, 22 denotes a tank circuit, 23 denotes a frequency dividing circuit, 24 denotes a synchronizing signal separating unit, 25 denotes a burst-gate pulse generating unit, 26 denotes a vertical blanking signal detecting unit, 27 denotes a phase comparing unit, 28 denotes an amplifier, 29 denotes a low-pass filter, 30 denotes an voltage controlled oscillator, and 31 denotes a frequency dividing circuit.

The synchronizing signal separating unit 24 separates a horizontal synchronizing signal from a composite color picture signal (composite video signal) to supply the separated horizontal synchronizing signal to the burst-gate pulse generating unit 25, and the remaining of the composite color picture signal is supplied to the vertical blanking signal detecting unit 26. The vertical blanking signal detecting unit 26 detects a duration (vertical blanking period) in which the vertical blanking signal exists in the composite color picture signal, and generates a blanking pulse which is active during the vertical blanking period. The burst-gate pulse generating unit 25 generates, as a burst-gate pulse, a gate pulse which is active in a phase range in which a color burst signal exists, based on the phase of the horizontal synchronizing signal and a predetermined phase difference between the horizontal synchronizing signal and the color burst signal, and supplies the burst-gate pulse to the burst signal extracting unit 21. The burst signal extracting unit 21 comprises a gate circuit, and extracts the color burst signal in the composite color picture signal by using the burst-gate pulse as a gate signal. The extracted color burst signal is supplied to the tank circuit 22. The tank circuit 22 has a resonant frequency which is the same frequency as the carrier frequency of the color burst signal, and amplifies the carrier frequency components of the color burst signal. The amplified carrier frequency components of the color burst signal are supplied by the tank circuit 22 to the frequency dividing circuit 23. The frequency dividing circuit 23 divides the frequency of the carrier frequency components of the color burst signal into a predetermined frequency which is suitable for phase comparison in the phase comparing unit 27. Then, the frequency-divided output of the frequency dividing circuit 23 is supplied to the phase comparing unit 27 as a phase reference signal. The phase comparing unit 27, the amplifier 28, the low-pass filter 29, the voltage controlled oscillator 30, and the frequency dividing circuit 31 constitute a phase synchronization loop. The voltage controlled oscillator 30 generates a clock signal having a frequency in accordance with a control voltage which is applied thereto from the low-pass filter 29. The clock signal generated by the voltage controlled oscillator 30 is output as an output of the phase-locked loop circuit of FIG. 5, and is supplied to the frequency dividing circuit 31. In the frequency dividing circuit 31, the frequency of the clock signal is divided into a comparison frequency, which is a frequency of the phase comparison performed in the phase comparing unit 27. The frequency-divided clock signal is supplied by the frequency dividing circuit 31 to the phase comparing unit 27. The phase comparing unit 27 compares the phase of the frequency-divided clock signal with the phase of the above phase reference signal supplied from the frequency dividing circuit 23, and outputs a voltage which corresponds to the phase difference between the phases of the frequency-divided clock signal and the phase reference signal. This voltage is amplified by the amplifier 28, and the output of the amplifier 28 is filtered by the low-pass filter 29 to be supplied to the voltage controlled oscillator 30 as the above control voltage. According to the first aspect of the present invention, the gain in the amplifier 28 is controlled by the above blanking pulse supplied from the vertical blanking signal detecting unit 26. Namely, when the blanking pulse is active, i.e., during the vertical blanking period, the gain of the amplifier 28 is reduced. In other words, the loop gain in the phase synchronization loop is reduced during the vertical blanking period of the composite color picture signal.

Figure 6:
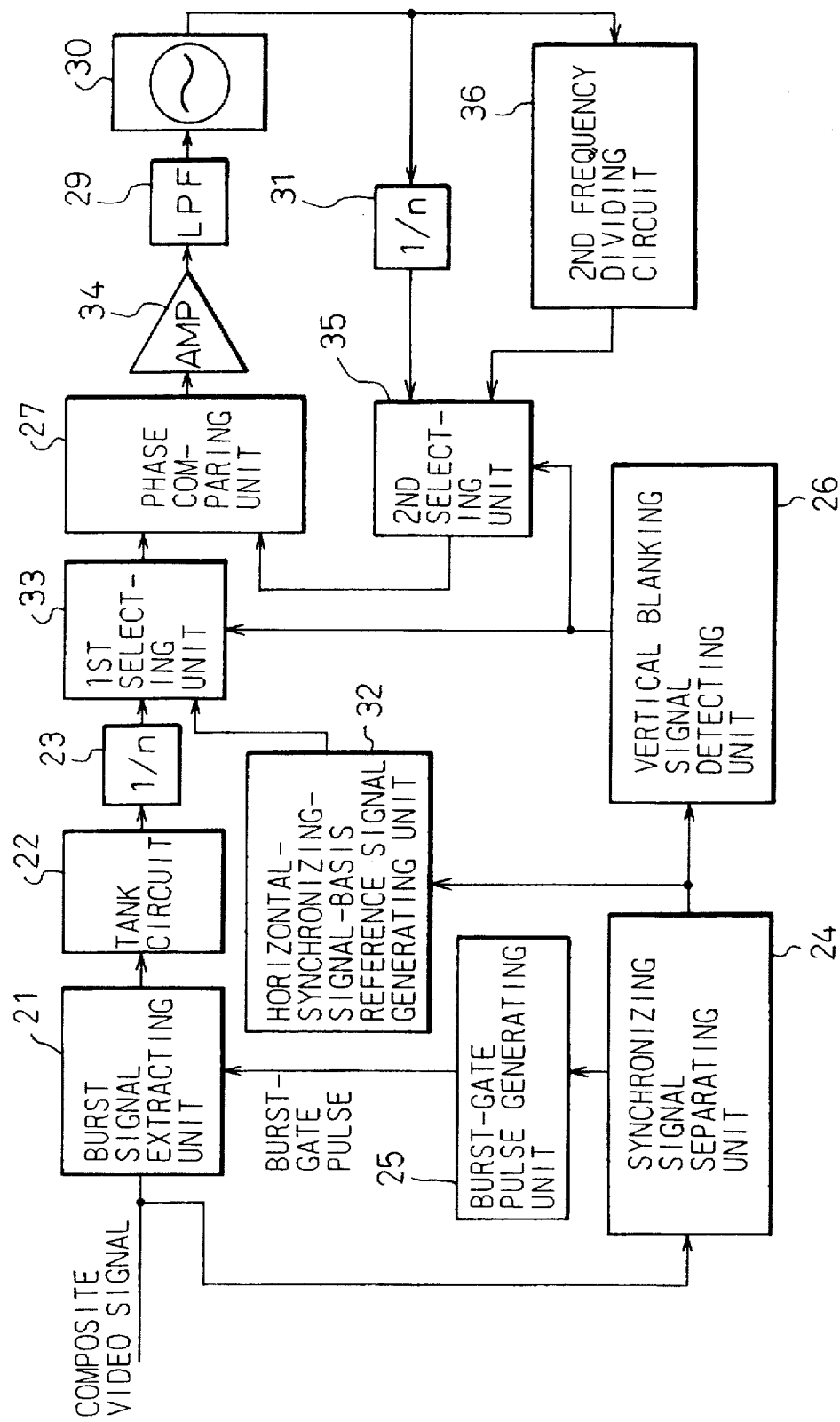
FIG. 6 is a diagram illustrating the construction of an embodiment of the second aspect of the present invention.

Embodiment of Second Aspect of Present Invention
(FIG. 6)

FIG. 6 is a diagram illustrating the construction of an embodiment of the second aspect of the present invention. As explained with reference to FIG. 2, the phase-locked loop circuit according to the second aspect of the present invention is provided for generating a clock signal synchronized with a color burst signal contained in a composite color picture signal which contains a vertical blanking signal and a synchronizing signal which has the same frequency as the horizontal synchronizing signal. In FIG. 6, reference numeral 32 denotes a horizontal-synchronizing-signal-basis reference signal generating unit. 33 denotes a first selecting unit. 34 denotes an amplifier. 35 denotes a second selecting unit. and 36 denotes a second frequency dividing circuit. All of the other elements in FIG. 6 are the same as the elements having the same reference numerals, respectively, except that the frequency dividing circuit 31 is referred to as a first frequency dividing circuit.

As explained with reference to FIG. 5, the frequency dividing circuit 23 generates the phase reference signal. In the construction of FIG. 6, this phase reference signal is referred to as a first phase reference signal, and is supplied to the first selecting unit 33. The horizontal-synchronizing-signal-basis reference signal generating unit 32 constantly generates as a second phase reference signal a signal of a phase which is different from the horizontal synchronizing signal by the above predetermined phase difference between the horizontal synchronizing signal and the color burst signal in the range of the composite color picture signal other than the vertical blanking period. Namely, in the vertical blanking period during which the color burst signal does not really exist in the composite color picture signal, the second phase reference signal is still generated with the predetermined phase difference from the phase of the above synchronizing signal. Therefore, the second phase reference signal, instead of the color burst signal, can be used as the phase reference signal in the phase synchronization loop in the construction of FIG. 6 during the vertical blanking period, and is supplied to the first selecting unit 33 as a selection control signal. According to the selection control signal, the first selecting unit 33 selects the first phase reference signal from the frequency dividing circuit 23 in the time range other than the vertical blanking period, and selects the second phase reference signal during the vertical blanking period. The selected one of the first and second phase reference signals is supplied to the phase comparing unit 27 for use in the phase comparison with the phase of the clock signal generated by the phase-locked loop circuit of FIG. 6.

In the phase synchronization loop in the construction of FIG. 6, in addition to the first frequency dividing circuit 31, the second frequency dividing circuit 36 is provided for dividing the frequency of the clock signal generated by the voltage controlled oscillator 30 when the second phase reference signal from the horizontal-synchronizing-signal-basis reference signal generating unit 32 is used during the vertical blanking period detected by the vertical blanking signal detecting unit 26. The second selecting unit 35 is provided for selecting one of the frequency-divided clock signals from the first and second frequency dividing circuits 31 and 36, according to the blanking pulse output from the vertical blanking signal detecting unit 26. The selected one of the frequency-divided clock signals is supplied to the phase comparing unit 27 for phase comparison with the selected one of the first and second phase reference signals supplied from the first selecting unit 33.

Figure 7:
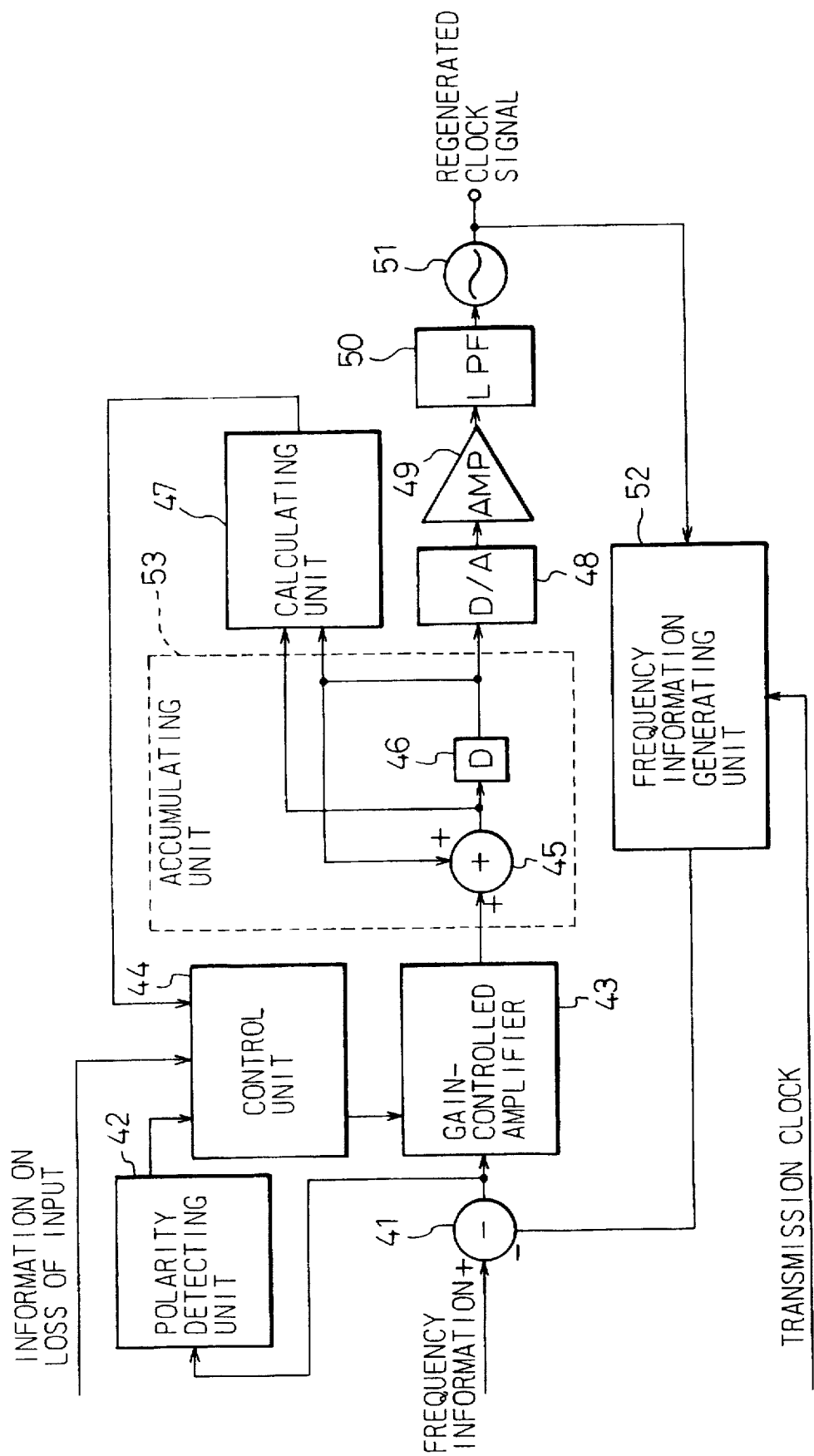
FIG. 7 is a diagram illustrating the construction of an embodiment realizing the third to fifth aspects of the present invention.
Figure 8:
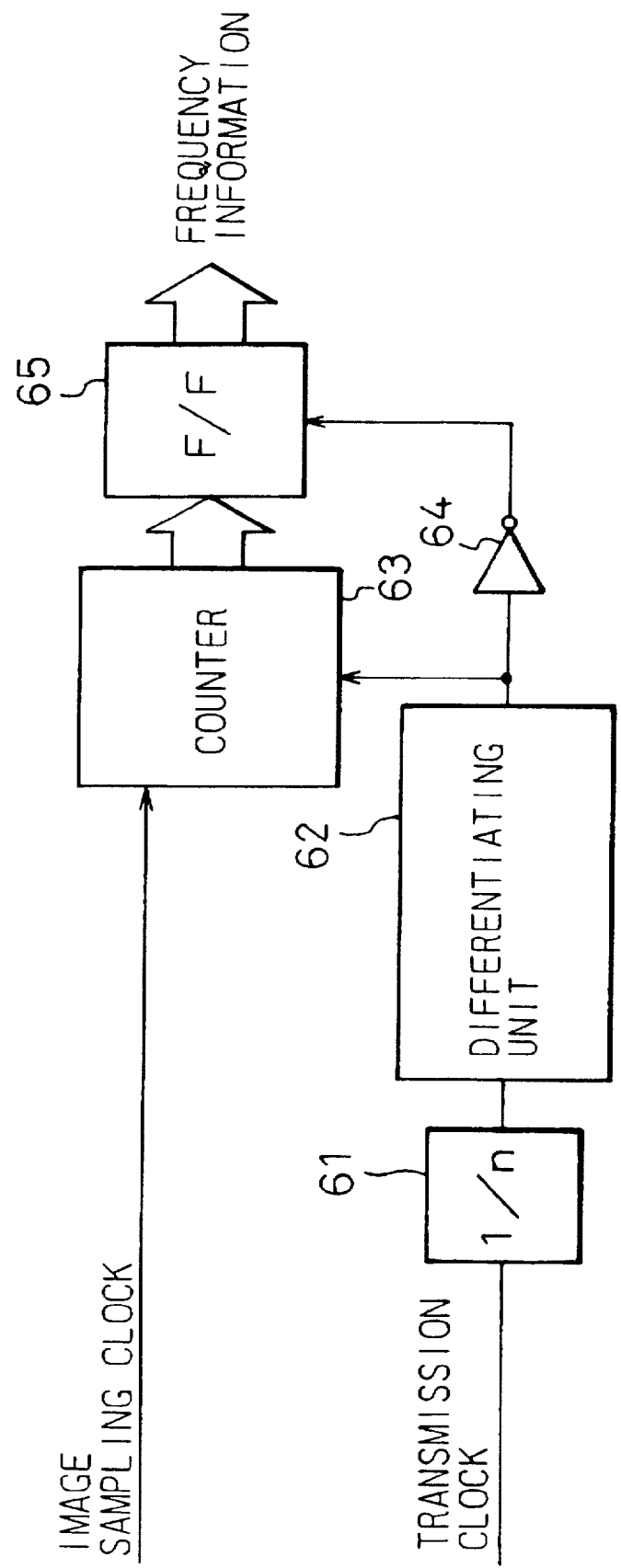
FIG. 8 is a diagram illustrating an example construction of the frequency information generating unit.

Embodiment of Third to Fifth Aspects of Present Invention (FIGS. 7, 8, and 9)

FIG. 7 is a diagram illustrating the construction of an embodiment realizing the third to fifth aspects of the present invention. As explained with reference to FIGS. 3 and 4, the phase-locked loop circuits according to the third to fifth aspects of the present invention are provided for generating a clock signal synchronized with a reference clock signal based on first frequency information which indicates a first frequency of the reference clock signal.

For example, the phase-locked loop circuit of FIG. 7 may be provided in a transmission apparatus, provided on the receiver side, which receives a digital (sampled) picture signal through a digital transmission line, and the reference clock signal in the embodiment of FIG. 6 may be an image clock signal (image sampling clock signal) which synchronizes with the digital picture signal, and the frequency information may indicate the number of reference clock pulses contained in a predetermined period which is determined based on the transmission clock signal. Therefore, this frequency information contains information on the frequency difference between the reference clock signal and the transmission clock signal. Although, generally, the number of the reference clock pulses contained in the predetermined period is great, only several bits in the lower places in the whole number representation are required to be transmitted as the first frequency information from the transmitter side to the receiver side since the above number is expected to vary within a small range.

FIG. 8 is a diagram illustrating an example construction for generating the above frequency information. In FIG. 8, reference numeral 61 denotes a frequency dividing circuit, 62 denotes a differentiating unit, 63 denotes a counter, 64 denotes an inverter, and 65 denotes a flip flop circuit. In the construction of FIG. 8, the frequency of the transmission clock signal is divided by the frequency dividing circuit 61. The frequency division ratio in the frequency dividing circuit 61 determines the above predetermined period based on the transmission clock signal. The frequency-divided transmission clock signal is differentiated by the differentiating unit 62, and the output of the differentiating unit 62 is supplied to the counter 63 as a counter reset signal which resets the counter 63. The image sampling clock signal is applied to the counter 63 to increment a count held in the counter 63 at every rising or falling edge of the image sampling clock signal. The count output of the counter 63 is supplied to the flip flop circuit 65. The flip flop circuit 65 latches the counter output when a latch control signal is applied thereto from the inverter 64. Therefore, the number of the rising or falling edges of the image sampling clock signal in the predetermined period is counted by the counter 63, and is latched and output by the flip flop circuit 65 as the above frequency information.

In FIG. 7, reference numeral 41 and 45 each denote an adder, 42 denotes a polarity detecting unit, 43 denotes a gain controlled amplifier, 44 denotes a control unit, 46 denotes a delay circuit, 47 denotes a calculating unit, 48 denotes a digital to analog converter, 49 denotes an amplifier, 50 denotes a low-pass filter, 51 denotes a voltage controlled oscillator, 52 denotes a frequency information generating unit, and 53 denotes an accumulating unit.

In the construction of FIG. 7, the frequency information generating unit 52 is provided for generating the second frequency information in the phase-locked loop circuit provided on the receiver side, and has the same construction as a construction (not shown) provided on the transmitter side for generating the first frequency information. These constructions may be as indicated in FIG. 8. In this case, the frequency information generating unit 52 counts the number of the rising or falling edges of the regenerated clock signal which is output from the voltage controlled oscillator 51, in the predetermined period determined based on the transmission clock signal, while the above-mentioned construction (not shown) provided on the transmitter side for generating the first frequency information, counts the number of the rising or falling edges of the image sample clock signal which synchronizes with the picture signal to be transmitted from the transmitter side.

The above second frequency information generated by the frequency information generating unit 52 is supplied as a subtrahend to the adder 41 which functions as a subtracter, and the first frequency information transmitted to the transmission apparatus containing the phase-locked loop circuit of FIG. 7, is supplied to the adder 41 as a minuend. Thus, a difference between the above numbers respectively indicated by the first and second frequency information is obtained by the adder 41, and the difference is supplied to the polarity detecting unit 42 and the gain controlled amplifier 43. The polarity detecting unit 42 detects the polarity of the above difference, and information on the detected polarity is supplied to the control unit 44.

In addition, to realize the fourth aspect of the present invention, the control unit 44 receives a value of a control voltage which is to be applied to the gain control amplifier 43, from the calculating unit 47 as explained later.

Further, to realize the fifth aspect of the present invention, the control unit 44 receives information on a loss of input of the first frequency information. This information may be transmitted from the transmitter side as information of the stop of the first information or a stop of the picture information, or the above information on a loss of input of the first frequency information may be generated on the receiver side from information on a loss of an input of the receiving signal. It is known that the loss of an input of the receiving signal is usually monitored in a signal reception unit in a transmission apparatus.

The gain controlled amplifier 43 receives the above difference between the numbers from the adder 41, and amplifies the same with a gain which is controlled by the control unit 44. According to the third aspect of the present invention, the control unit 44 monitors the polarity detected by the polarity detecting unit 42, and reduces the gain of the gain controlled amplifier 43 when a change of the polarity is detected. In addition, to realize the fourth aspect of the present invention, the control unit 44 receives the above-mentioned value of the control voltage, and applies the control voltage of the received value to the gain controlled amplifier 43 to control the gain thereof. Further, according to the fifth aspect of the present invention, the control unit 44 suppresses the gain of the gain controlled amplifier 43 when the above information of a loss of an input of the first frequency information is input into the control unit 44.

To realize the fourth aspect of the present invention, the output of the gain controlled amplifier 43 is accumulated by the accumulating unit 53. The accumulating unit 53 is provided because generally the center frequency of the voltage controlled oscillator 51 is different from the frequency of the clock signal to be generated, and therefore a control voltage which is to be applied to the voltage controlled oscillator 51 must not equal zero. In the example of FIG. 7, the accumulating unit 53 comprises the adder 45 and the delay circuit 46, where the delay circuit 46 holds an accumulated value obtained in the previous cycle of digital operations, and the adder 45 adds the output of the gain controlled amplifier 43 to the accumulated value of the previous cycle to obtain an accumulated value of the current cycle. Both the accumulated values of the previous and current cycles are supplied to the calculating unit 47, and the accumulated value of the previous cycle is supplied to the digital to analog converter 48, in which the above accumulated value is converted to an analog voltage. Then, the analog voltage is amplified by the amplifier 49, and is filtered by the low-pass filter 50 to obtain a control voltage to be applied to the voltage controlled oscillator 51.

The calculating unit 47 obtains the difference between the accumulated values of the previous and current cycles, and converts the value of the difference into a control value, for example, so that the relationship between the input value of the gain controlled amplifier 43 and the above accumulated value output from the accumulating unit 53 to the digital to analog converter 48 is as indicated in FIG. 9. In the example of FIG. 9, when the absolute value of the above difference between the accumulated values of the previous and current cycles does not exceed a maximum stability limit, which is predetermined, the gain of the gain controlled amplifier 43 is not reduced. However, when the absolute value of the above difference between the accumulated values of the previous and current cycles exceeds the maximum stability limit, the greater the absolute value of the above difference between the accumulated values of the previous and current cycles becomes, the greater reduction of the gain is effected in the gain controlled amplifier 43. The above control value, obtained by the calculating unit 47, is supplied to the control unit 44 as mentioned above. Namely, the control unit 44 performs the above-mentioned control operation based on the output of the calculating unit 47 according to the fourth aspect of the present invention. Thus, a rapid change in the frequency of the regenerated clock signal is prevented. The above calculating unit 47 may be realized by, for example, a read-only memory (ROM). Generally, the calculating unit 47, the polarity detecting unit 42, and control unit 44 each may be realized either hardware logic circuitry, software, or any combination thereof.

I claim:

1. A phase-locked loop circuit to generate a clock signal synchronized with a color burst signal contained in a composite color picture signal which contains a vertical blanking signal, comprising:

a burst signal extracting unit to input the composite color picture signal, extract the color burst signal from the composite color picture signal, and output a reference signal indicating a phase of the color burst signal;

a phase-locked loop unit, containing a phase synchronization loop having a loop gain, to generate the clock signal so that the generated clock signal synchronizes with the color burst signal, by comparing a phase of the generated clock signal with the phase of the color burst signal extracted by the burst signal extracting unit, and by controlling the phase of the generated clock signal to reduce a difference between the phases of the generated clock signal and the color burst signal;

a vertical blanking signal detecting unit to detect the vertical blanking signal; and a loop gain control unit to control the phase-locked loop unit so that the loop gain in the phase synchronization loop is reduced when the vertical blanking signal is detected by the vertical blanking signal detecting unit.

2. A phase-locked loop circuit to generate a clock signal synchronized with a color burst signal contained in a composite color picture signal which contains a vertical blanking signal and a synchronizing signal which has the same frequency as a horizontal synchronizing signal, comprising:

a burst signal extracting unit to input the composite color picture signal, extract the color burst signal from the composite color picture signal, and output a first reference signal which indicates timing of the color burst signal;

a horizontal-synchronizing-signal-basis reference signal generating unit to input the composite color picture signal, extract the synchronizing signal from the composite color picture signal, and generate, based on timing of the synchronizing signal, a second reference signal which indicates timing synchronized with the color burst signal;

a vertical blanking signal detecting unit to detect a first duration of the vertical blanking signal;

a reference signal selecting unit to select the first reference signal for a second duration other than the first duration detected by the vertical blanking signal detecting unit and to select the second reference signal for the first duration; and a phase-locked loop unit to generate said clock signal so that the generated clock signal synchronizes with a phase reference signal, wherein said reference signal selecting unit supplies the selected one of the first and second reference signals to said phase-locked loop unit as the phase reference signal.

3. A phase-locked loop circuit according to claim 2, wherein said phase-locked loop unit comprises, a phase comparing unit to compare the phase of the generated clock signal with the phase of the phase reference signal to output a result of the comparison, a controlled oscillator unit to generate the clock signal, wherein the phase of the generated clock signal is controlled according to the result of the comparison, and a frequency dividing unit to divide a frequency of the clock signal;

said frequency dividing unit comprises, a first frequency dividing unit to generate a first frequency-divided clock signal for use in the phase comparing unit when the reference signal selecting unit selects the first reference signal, a second frequency dividing unit to generate a second frequency-divided clock signal for use in the phase comparing unit when the reference signal selecting unit selects the second reference signal, and a frequency-divided clock signal selecting unit to select the first frequency-divided clock signal for the second duration other than the first duration and to select the second frequency-divided clock signal for the first duration to supply the selected one of the first and second frequency-divided clock signals to the phase comparing unit for comparison with the phase reference signal.

* * * * *